United States Patent
Metzmacher et al.

(10) Patent No.: US 9,421,647 B2
(45) Date of Patent: Aug. 23, 2016

(54) METHOD OF MANUFACTURING MIRROR SHELLS OF A NESTED SHELLS GRAZING INCIDENCE MIRROR

(71) Applicant: USHIO DENKI KABUSHIKI KAISHA, Tokyo (JP)

(72) Inventors: Christof Metzmacher, Raeren (BE); Max Christian Schuermann, Luebbecke (DE)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 308 days.

(21) Appl. No.: 14/107,118

(22) Filed: Dec. 16, 2013

(65) Prior Publication Data
US 2014/0173875 A1     Jun. 26, 2014

(30) Foreign Application Priority Data
Dec. 20, 2012  (EP) ..................... 12008518

(51) Int. Cl.
*B23P 13/00* (2006.01)
*G03F 7/20* (2006.01)
*G21K 1/06* (2006.01)

(52) U.S. Cl.
CPC ............. *B23P 13/00* (2013.01); *G03F 7/70166* (2013.01); *G03F 7/70833* (2013.01); *G03F 7/70975* (2013.01); *G21K 1/067* (2013.01); *Y10T 29/49826* (2015.01)

(58) Field of Classification Search
CPC ............. G03F 7/70166; G03F 7/7095; G03F 7/70833; B23P 13/00; G21K 1/067; G02B 26/0841; B60R 1/1027; B22F 3/1055
See application file for complete search history.

(56) References Cited

U.S. PATENT DOCUMENTS

| 5,768,339 A | 6/1998 | O'Hara ..................... 378/147 |
| 2003/0043483 A1 | 3/2003 | Folta et al. .................. 359/883 |

FOREIGN PATENT DOCUMENTS

| DE | WO 201301714 A1 * | 2/2013 | ........... B22F 3/1055 |
| EP | 2 083 328 A1 | 7/2009 | ............... G21K 1/06 |

OTHER PUBLICATIONS

*Automated finishing of diamond turned dies for hard X-ray and EUV optics replication;* Beaucamp et al.; Proceedings of SPIE—The International Society for Optical Engineering—Advances in X-Ray/EUV Optics and Components VII 2012; SPIE USA, vol. 8502, Oct. 15, 2012.

(Continued)

*Primary Examiner* — David Bryant
*Assistant Examiner* — Lee A Holly
(74) *Attorney, Agent, or Firm* — Renner Kenner Greive Bobak Taylor & Weber

(57) ABSTRACT

The present invention relates to a method of manufacturing mirror shells of a nested shells grazing incidence mirror, in particular for EUV radiation and/or X-rays. In the method a blank of a bulk material is provided and machined to form a mirror body of the shell. Mechanical structures are integrated and/or attached to the mirror body during and/or after the machining step. The mechanical structures are required for mounting and/or operating the mirror shells. After these steps the optical surface is formed on the mirror body by diamond turning. The proposed method allows the manufacturing of mirror shells of a nested shells grazing incidence mirror at low costs with high optical quality which may also be refurbished one or several times.

9 Claims, 3 Drawing Sheets

(56) References Cited

OTHER PUBLICATIONS

*EUV Collectors: Design, Development, Fabrication and Testing*; Egle et al.; Proceedings of SPIE; SPIE, USA, vol. 5193, Jan. 1, 2004, pp. 39-49.
*Precision machining of electroless nickle mandrel and fabrication of replicated mirrors for a soft X-ray microscope*; Chon et al.; JSME International Journal, Series C; Mechanical Systems, Machine Elements and Manufacturing, Japan Society of Mechanical Engineers, JP; vol. 49, No. 1, Sep. 15, 2006, pp. 56-62.
*Development of Wolter I x-ray optics by diamond turning and electrochemical replication*; Fawcett et al.; Precision Engineering, Butterworth-Heinemann Ltd., vol. 17, No. 4, Oct. 1995, pp. 290-297.
Search Report mailed Sep. 2, 2013 in corresponding application No. 12008518.8.

* cited by examiner

METHOD OF MANUFACTURING MIRROR SHELLS OF A NESTED SHELLS GRAZING INCIDENCE MIRROR

BACKGROUND OF THE INVENTION

The present invention relates to a method of manufacturing mirror shells of a nested shells grazing incidence mirror, in particular for extreme ultraviolet radiation (EUV) and/or x-rays. Such a nested shells grazing incidence mirror comprises several mirror shells which are typically arranged concentrically around an optical axis along which the incidence radiation enters the mirror.

Nested shells grazing incidence mirrors are used in x-ray, soft x-ray and EUV applications, e.g. in space-based x-ray telescopes or as collector mirrors or collector optics in EUV applications like EUV lithography.

PRIOR ART

Grazing incidence mirrors make use of the physical effect of total reflection of radiation impinging on the surface of a medium under a small angle of incidence. This allows a rather simple realization of mirrors for x-rays or EUV radiation without the need of a high precision multi layer coatings as is the case for near normal incidence mirrors. In contrast to near normal incidence mirrors, the mirror shells of a nested shells grazing incidence mirror have a comparatively small thickness in the direction perpendicular to the reflecting surface in order to minimize the loss of the incoming radiation which also impinges on the side edges of the shells.

The small thickness and the required high optical quality of the optical surface of such a mirror shell require a careful manufacturing process. Document EP 2083328 A1 discloses two manners of manufacturing such mirror shells.

In one of the methods proposed in EP 2083328 A1 the shells are manufactured by electroforming in which the shell material is galvanically deposited on a mandrel, which carries the negative of the required optical surface with respect to shape and roughness. After thermal break of shell and mandrel, a reflective coating can be applied to the optical surface of the shell if required. The mandrel can be reused for further replications unless it is destroyed during the separation process. The individual shells are then mounted to a mechanical support structure, typically some kind of spider wheel, to form the nested shells grazing incidence mirror. The manufacturing of the mirror shells by galvanic deposition however has a number of disadvantages. The bulk material of the shell must be compatible with the electroforming process. This limits the material choice to a couple of pure metals with only very few exceptions. Consequently, there are restrictions with respect to the material properties desired for the application. The dedicated galvanic deposition of the material is slow and without further measures does not allow a variation in thickness of the shell. Furthermore, the manufactured shells are very fragile and do not allow a refurbishment of the optical surface after degradation which occurs during operation of the mirror, e.g. close to an EUV source. The galvanic deposition furthermore has a significant impact on the costs of the grazing incidence mirror. Due to the fragility of the mirror shells it is also difficult to attach further mechanical structures which are required for mounting the mirror or during operation of the mirror, e.g. cooling structures. There is a high risk of damaging the surface during such later manufacturing steps, in particular when techniques like welding, drilling or milling are necessary.

Another method of manufacturing the mirror shells is only very shortly mentioned in EP 2083328 A1. This further method comprises to manufacture the mirror shells by diamond turning in order to achieve shells with a thickness of between 0.5 and 4 mm. The document does not further describe this manufacturing process. Further required mechanical structures for a thermal management system are mounted on the mirror shells, e.g. by micro-machining the rear surface of the mirror shells. Nevertheless, the thickness of the shells mentioned in this document also results in a high fragility so that several of the above mentioned disadvantages still apply.

Diamond turning is a well established technique for the manufacturing of reflective optical elements. U.S. Pat. No. 6,634,760 describes an ultra-precision diamond turning technique in which the mechanical process is combined with the deposition of a smoothing layer in order to achieve an optical surface with a high optical quality.

SUMMARY OF THE INVENTION

It is an object of the present invention to provide a method of manufacturing mirror shells of a nested shells grazing incidence mirror at low costs with high optical quality which may also be refurbished one or several times.

The object is achieved with the method of manufacturing the mirror shells according to claim 1. Advantageous embodiments of the method are subject matter of the dependent claims or can be deduced from the subsequent portions of the description of the invention and embodiments.

The proposed method comprises the steps of providing and machining a blank of a bulk material to form a mirror body of the shell. During or after the machining of the blank mechanical structures are integrated and/or attached in and/or to the mirror body. These mechanical structures may be required for mounting and/or operating the mirror shells. Examples of such mechanical structures are cooling channels which are required for cooling the mirror shells during operation. Such mechanical structures may also be mounting elements for mounting the mirror shells to a corresponding mechanical support structure which is required to assemble the nested shells grazing incidence mirror. These steps of integrating the mechanical structures or attaching these structures—or both measures in combination—may be performed during the machining of the blank, e.g. by forming appropriate grooves for the cooling channels, or immediately after forming the mirror body. The structures can also be attached for example by appropriate techniques like welding, brazing or screwing. After the integration and/or attachment of the mechanical structures the optical surface is formed on the mirror body by diamond turning. Depending on the material selected for the mirror body the diamond turning may be performed directly on the surface of the mirror body or may also be performed on a coated layer of an appropriate material which may be applied prior to this last step of diamond turning to the corresponding regions of the surface of the body.

Since the manufacturing steps for forming the mirror body and integrating and/or attaching all required further mechanical structures are performed prior to the manufacturing step of diamond turning the optical surface, the risk of a deformation or damaging of the optical surface due to rough process steps is avoided. By this, usual manufacturing techniques like brazing, welding, drilling, milling and turning are possible to generate the required mechanical structures for cooling and mounting. Since the optical surface is formed in the latest step, which may also include a further polishing or coating, the imaging quality of the optical system is better than with other techniques in which the mechanical structures are applied after the formation of the optical surface. The proposed method of machining the mirror body from a blank, e.g. by milling, and forming the optical surface by diamond turning allows the selection of a large amount of shell materials. The material of the mirror body can thus be selected to optimally support the needs of the application, e.g. thermo-mechanically and/or chemically. The manufacturing process does not result in any restrictions for the shell thickness and therefore also strong variations of the thickness within a shell are possible, if desired. The mirror body may be formed of an appropriate thickness to allow a refurbishment of the optical surface by a second or further diamond turning run in cases in which the surface is degraded after a certain operation time. In case of the diamond turning being carried out in a coating on the mirror body, also a second diamond turning run is possible in the coating. Alternatively the coating (or its rest) is first removed and a new coating is applied. The diamond turning finishing process is then repeated with this new coating. The coating can be removed for example by another diamond turning step or by chemical treatment. Using such a refurbishment costly manufacturing steps on the blank like forming of the complex cooling structures can be avoided since the mirror shell is simply recycled.

In an advantageous embodiment the mirror body is formed to have a varying thickness, the thickness being measured perpendicular to the optical surface. This thickness is smallest at the edges and increases from both edges to provide one or several thicker portions in between. The number, position, shape and maximum thickness of these thicker portions is selected to avoid a blocking of the incoming radiation by the thicker portions when the shells are mounted in the nested shells grazing incidence mirror. With such a design of the mirror body the thicker portions can have up to several centimeters in thickness without blocking the incoming radiation, in particular if the mirror body is formed to have knife edge shaped edges.

The mirror body is manufactured with a thickness of ≥5 mm at the thickness maximum of at least one of the thicker portions. With such a thickness, the problems related to a fragility of the shells are substantially reduced resulting in a lower risk of damage during manufacturing and/or later refurbishment.

In the proposed method it is also possible to additionally polish the optical surface after the diamond turning process. Furthermore, also one or several additional coatings may be applied to the optical surface, e.g. a coating for increasing the reflectivity of the surface or a coating for increasing the mechanical and/or chemical stability of the surface.

BRIEF DESCRIPTION OF THE DRAWINGS

The proposed method is described in the following by way of example in connection with the accompanying figures which show.

DESCRIPTION OF EMBODIMENTS

Figure 1:
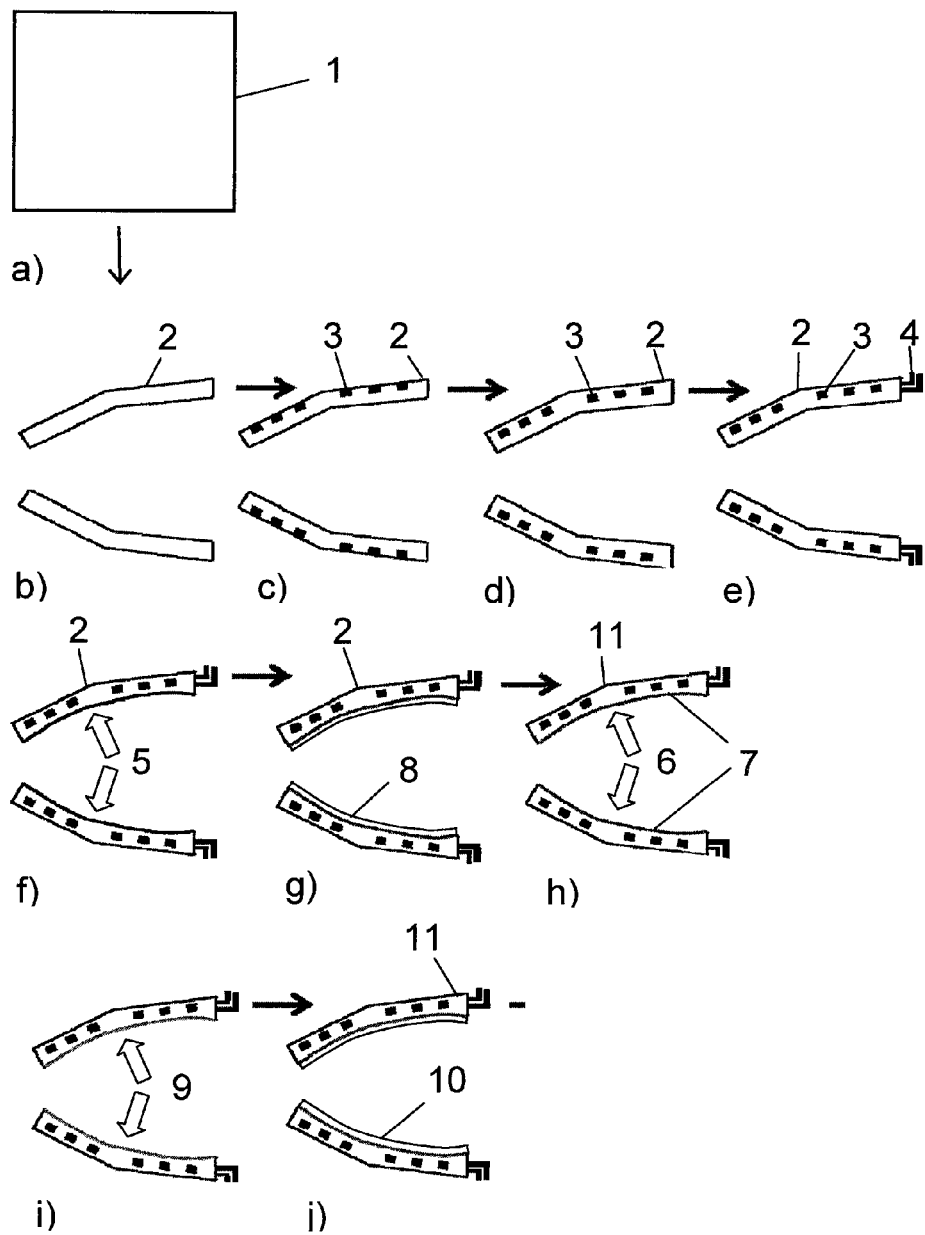
FIG. 1 an example of manufacturing steps of the proposed method.

In the proposed method of manufacturing mirror shells of a nested shells grazing incidence mirror, first the body of the mirror is made, including e.g. the cooling channels and the fixation points for later mounting. After the body is completely finished, the optical surface is generated by an ultra-precision diamond turning process. For diamond turning, the process described in U.S. Pat. No. 6,634,760 may be used for example. With the process flow of the proposed method it is also possible to refurbish the shells as explained further on. An example for the method steps of the proposed method, some of which being optional steps, is shown in connection with FIG. 1. The figure shows the manufacturing process of a mirror shell in a cross sectional view.

Starting point is a block 1 of material with a size that is sufficient for machining the body of the shell. The material is selected to have material properties that fit to the application in a collector shell, for example for EUV applications. First of all, rough production steps like milling the block 1 of material are carried out to form the body 2 of the mirror shell as schematically indicated in FIGS. 1a and 1b. An appropriate material is e.g. aluminum.

After the formation of the mirror body cooling channels are milled into the side faces of the mirror body 2 to form the cooling structure as schematically shown in FIG. 1c. The cooling structure is sealed e. g. by welding or brazing in FIG. 1d. FIG. 1e shows the attachment of mounting jigs 4 which may be fixed by welding or screwing. These mounting jigs 4 are necessary for the mounting and connecting the shells to the mounting structure of the nested shells grazing incidence mirror. After these rough manufacturing steps a functional test of these components, e.g. a leak test of the cooling structure or a test of the stiffness of the mirror body may be applied.

After the manufacturing of all of the necessary mechanical components or structures the optical surface of the shell is machined. To this end the thickness of the mirror body in the direction perpendicular to the optical surface may be chosen slightly larger than needed. For forming the optical surface different combinations of manufacturing steps may be applied, all of these steps include a diamond turning process for finishing of the optical surface. FIGS. 1f to 1j show these different steps some of which are only optional steps.

If the chosen blank material allows the surface finishing of the desired quality, the diamond turning process can be directly applied to generate the optical surface which is shown with the diamond turning finishing process 6 in FIG. 1h. Nevertheless there might be the necessity of more than one turning run. The optical surface 7 will then not be disturbed by other rough manufacturing processes.

If the blank material does not support the required surface quality directly, material from the inner surface of the mirror body may be turned away in the diamond turning pre-machining step 5 of FIG. 1f so that the desired surface is slightly outside the blank material. Now a layer 8 of a material which supports the required surface quality is coated on the blank inner surface as schematically indicated in FIG. 1g. This material may be a nickel rich material like nickel-phosphor. The desired surface is now within the layer 8 of the coating material. The optical surface is then generated by one or more diamond turning runs with the diamond turning finishing process 6 of FIG. 1h.

If required, the surface roughness of the optical surface can further be reduced by a conventional polishing step 9 (optional) schematically indicated in FIG. 1j. Also a coating of one or more layers 10 may be applied to increase the reflectivity and/or the mechanical or chemical stability, if necessary. This optional step is schematically indicated in FIG. 1j in which, for example, a layer of ruthenium may be applied as a reflective coating.

Figure 2:
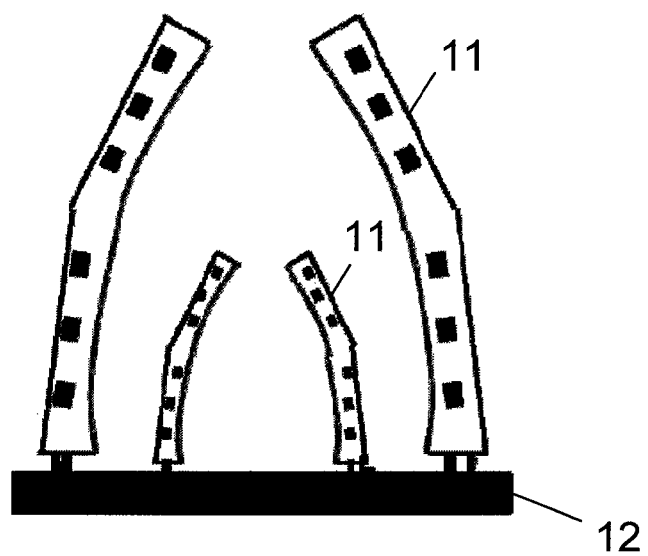
FIG. 2 a schematic view of a nested shells grazing incidence mirror.

After having manufactured the different mirror shells required for assembling the nested shells grazing incidence mirror, the shells 11 are mounted to a mechanical support structure 12, e.g. some kind of spider wheel as known from existing grazing incidence collectors, to form the nested shells mirror. FIG. 2 schematically shows a cross sectional view of such a nested shells grazing incidence mirror. In this figure only two shells 11 are shown. It is obvious for the skilled person that such a nested shells grazing incidence mirror may have more than two shells 11 concentrically arranged around the optical axis.

With the proposed order of manufacturing steps the assembly of the shell modules is easier because a wider choice of e.g. welding and clamping techniques is possible for manufacturing the mechanical structures, since these techniques do not affect the optical surface of the shells. The proposed method also allows manufacturing of shells with non monotone optical surfaces by diamond turning.

Additionally, further mechanical structures may be integrated in or attached to the mechanical shells without deteriorating the optical quality due to the order of the proposed method steps, i.e. the generation of the optical surface in the final step. For example, EUV light sources do not only emit photons but also produce undesired material, so called debris, such as droplets or atoms. The debris may condense on the optical components whose performance would deteriorate appropriately. It is known in the art to apply debris mitigation systems by assistance of certain inert gases to reduce this negative impact on system performance. Due to the flexibility and robustness of the diamond turning process, it is possible to realized dedicated layouts of shells resulting in an improved debris mitigation performance of the optical system. This can be achieved by e.g. drilling additional holes or add gas line tubing at certain locations, in particular locations which are shadowed by the mechanical support structure of the shells, to allow for a particular gas distribution which enhances debris mitigation performance. This is impossible with a conventional manufactured nested shell optic but can be integrated in the proposed manufacturing process easily. The proposed manufacturing method allows to realize a grazing incidence collector that is much cheaper to produce, more robust and can be refurbished several times.

Figure 3:
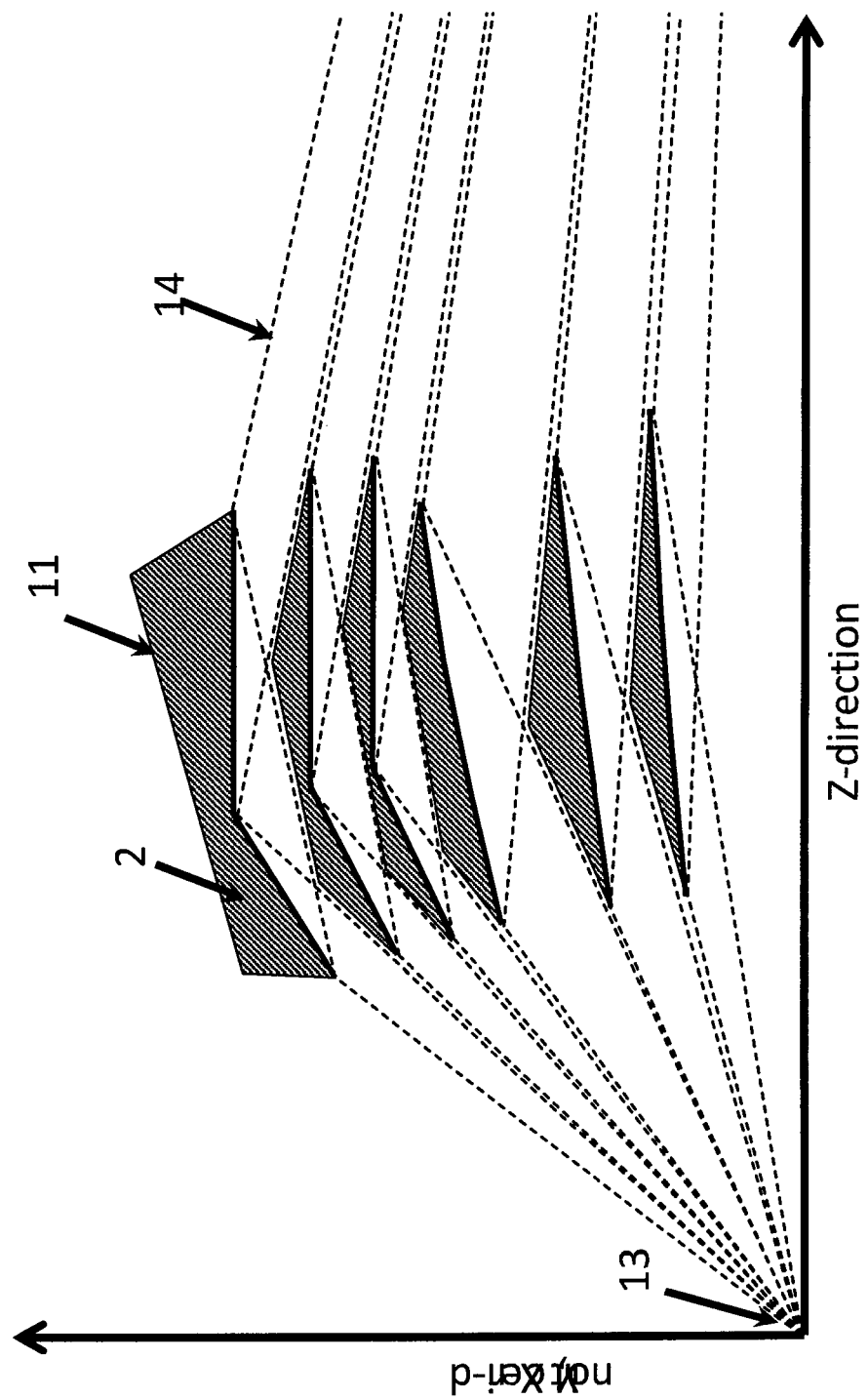
FIG. 3 a schematic cross sectional view of a part of a nested shells grazing incidence mirror having mirror shells with varying thickness.

The mirror body 2 of the mirror shells 11 is preferably formed to have a varying thickness increasing from both edges and forming one or several thicker portions in between. FIG. 3 shows a schematic cross sectional view of a part of such a nested shells grazing incidence mirror.

Both edges of the mirror bodies 2 of the inner shells are formed knife edge shaped while still having at least one portion with several centimeters thickness in between without blocking incoming EUV-radiation. The number, position and shape of these thicker portions is selected to avoid the blocking of the radiation. This can be seen from FIG. 3 in which some of the incoming EUV-rays 14 originating from the EUV-source 13 are indicated. With the proposed method it is thus possible to design and manufacture an almost obscuration free collector consisting of very robust (=thick) mirror shells.

While the invention has been illustrated and described in detail in the drawings and forgoing description, such illustration and description are to be considered illustrative or exemplary and not restrictive; the invention is not limited to the disclosed embodiments. For example, although the figures show a special curved shape of the mirror shells also other shapes are possible. The mechanical structures manufactured prior to the final diamond turning step may also be different from the structures shown in the figures. Other variations of the disclosed embodiments can be understood and affected by those skilled in the art in practicing the claimed invention, from a study of the drawings, the disclosure, and the appended claims. In the claims the word "comprising" does not exclude other elements or steps and the indefinite article "a" or "an" does not exclude a plurality. The mere fact that certain measures are recited in mutually different dependent claims does not indicate that a combination of these measures can not be used to advantage. The reference signs in the claims should not be construed as limiting the scope.

LIST OF REFERENCE SIGNS 1 block of material (blank)
2 mirror body
3 cooling channels
4 mounting jigs
5 diamond turning pre-machining step
6 diamond turning finishing process
7 optical surface
8 layer of material
9 polishing
10 coating
11 mirror shell
12 support structure
13 EUV-source
14 EUV-ray

The invention claimed is:

1. A method of manufacturing mirror shells of a nested shells grazing incidence mirror, in particular for EUV radiation and/or X-rays, the method at least comprising the steps of
  providing and machining a blank of a bulk material to form a mirror body of the shell, wherein said mirror body is formed to have edges which are knife edge shaped
  integrating and/or attaching mechanical structures in and/or to the mirror body during and/or after said step of machining the blank, and
  forming an optical surface on the mirror body including said mechanical structures by diamond turning.

2. The method according to claim 1, wherein said step of forming the optical surface includes the steps of
  coating the mirror body at least in a region in which said optical surface is formed with a layer of a second material, said second material being selected to allow the formation of the optical surface from said second material by diamond turning, and
  diamond turning said layer of the second material.

3. The method according to claim 1, wherein said step of integrating and/or attaching mechanical structures includes integrating and/or attaching cooling channels and/or mounting elements in and/or to the mirror body.

4. The method according to claim 1, wherein said machining of the blank to form the mirror body comprises at least a milling process.

5. The method according to claim 1, wherein said attaching of mechanical structures to the mirror body comprises at least one of welding and brazing and screwing said structures to the mirror body.

6. The method according to claim 1, wherein said mirror body is formed to have a thickness increasing from both edges of the mirror body to form at least one thicker portion in between.

7. The method according to claim 1, wherein said mirror body is formed to have a thickness of $\geq 5$ mm at a thickness maximum of said at least one thicker portion.

8. The method according to claim 1, wherein the optical surface is additionally polished.

9. The method according to claim 1, wherein the optical surface is additionally coated by an appropriate material increasing the reflectivity and/or the mechanical and/or chemical stability of the optical surface.

* * * * *